United States Patent [19]

Yu et al.

[11] Patent Number: 5,086,477
[45] Date of Patent: Feb. 4, 1992

[54] AUTOMATED SYSTEM FOR EXTRACTING DESIGN AND LAYOUT INFORMATION FROM AN INTEGRATED CIRCUIT

[75] Inventors: Kenneth K. Yu, Beaverton; C. Neil Berglund, Oregon City, both of Oreg.

[73] Assignee: Northwest Technology Corp., Beaverton, Oreg.

[21] Appl. No.: 564,175

[22] Filed: Aug. 7, 1990

[51] Int. Cl.$^5$ ............................................. G06K 9/00
[52] U.S. Cl. ......................................... 382/8; 382/56; 358/101
[58] Field of Search ................. 382/8, 56; 364/522, 364/489, 490, 491; 358/101, 107

[56] References Cited

U.S. PATENT DOCUMENTS

| | | | |
|---|---|---|---|
| 3,882,462 | 5/1975 | McMahon | 340/146.3 E |
| 3,916,340 | 10/1975 | Scott | 331/107 S |
| 3,975,710 | 8/1976 | Watanabe et al. | 340/146.3 C |
| 4,011,441 | 3/1977 | Michon et al. | 235/193 |
| 4,163,212 | 7/1979 | Buerger et al. | 340/146.3 H |
| 4,233,625 | 11/1980 | Altman | 358/101 |
| 4,301,958 | 11/1981 | Hatakenaka et al. | 228/4.5 |
| 4,347,964 | 9/1982 | Takasugi et al. | 228/4.5 |
| 4,388,610 | 6/1983 | Tsunekawa | 382/8 |
| 4,479,236 | 10/1984 | Sakoe | 381/43 |
| 4,491,962 | 1/1985 | Sakou et al. | 382/50 |
| 4,515,480 | 5/1985 | Miller et al. | 356/400 |
| 4,520,313 | 5/1985 | Allred, Jr. et al. | 324/158 R |
| 4,543,659 | 9/1985 | Ozaki | 382/8 |
| 4,557,599 | 12/1985 | Zimring | 356/243 |
| 4,590,582 | 5/1986 | Umemura et al. | 364/724 |
| 4,651,341 | 3/1987 | Nakashima et al. | 382/34 |
| 4,665,556 | 5/1987 | Fukushima et al. | 382/41 |
| 4,694,186 | 9/1987 | Onoda et al. | 250/578 |
| 4,703,185 | 10/1987 | Eigenstetter et al. | 250/548 |
| 4,736,437 | 4/1988 | Sacks et al. | 382/34 |
| 4,744,550 | 5/1988 | Oglesbee | 269/21 |
| 4,746,856 | 5/1988 | Allred, Jr. et al. | 324/158 R |
| 4,790,027 | 12/1988 | Scherl | 382/54 |
| 4,792,982 | 12/1988 | Devos et al. | 382/68 |
| 4,795,260 | 1/1989 | Schuur et al. | 356/400 |
| 4,795,518 | 1/1989 | Meinel et al. | 156/285 |
| 4,799,854 | 1/1989 | Niskala | 414/737 |
| 4,800,431 | 1/1989 | Deering | 358/160 |
| 4,812,901 | 3/1989 | Karasawa | 358/101 |
| 4,817,175 | 3/1989 | Tenebaum et al. | 382/41 |
| 4,823,394 | 4/1989 | Berkin et al. | 382/8 |
| 4,845,362 | 7/1989 | Sicignano et al. | 250/310 |
| 4,864,229 | 9/1989 | Lauks et al. | 324/158 F |
| 4,866,782 | 9/1989 | Sugie et al. | 382/22 |
| 4,872,052 | 1/1989 | Liudzius et al. | 358/106 |
| 4,877,173 | 10/1989 | Fujimoto et al. | 228/1.1 |
| 4,894,790 | 1/1990 | Yotsuya et al. | 364/552 |

OTHER PUBLICATIONS

"Cognex: Vision for Industry", (Technical Description), Cognex Corporation, 1989, pp. 5-27.

*Primary Examiner*—Leo H. Boudreau
*Assistant Examiner*—Andrew W. Johns
*Attorney, Agent, or Firm*—Blakley, Sokoloff, Taylor & Zafman

[57] ABSTRACT

A system for extracting design information from a semiconductor integrated circuit (IC) is disclosed. The system includes a microscope and camera for capturing a composite image of the IC in the form of a video signal. Image capture occurs on a section-by-section basis in which a "snapshot" of each section is taken, the die-holding table stepped to a new section, and a snapshot of the new section obtained. This image capture operation continues until a composite image of the IC is obtained by successive capture of contiguous or partially overlapping images covering all of the different sections of the die. An image processor receives the video signal from the optical means and generates an abstract representation of the die in the form of lists of identifying features such as the size, type and relative location of all transistors, and the width, length and relative location of all of the metal interconnects to the IC. These lists are subsequently compared with reference library circuits by a computer to recognize individual circuit cells. Once all of the ciruit cells on the die have been recognized, the computer then generates a schematic netlist of the IC.

35 Claims, 6 Drawing Sheets

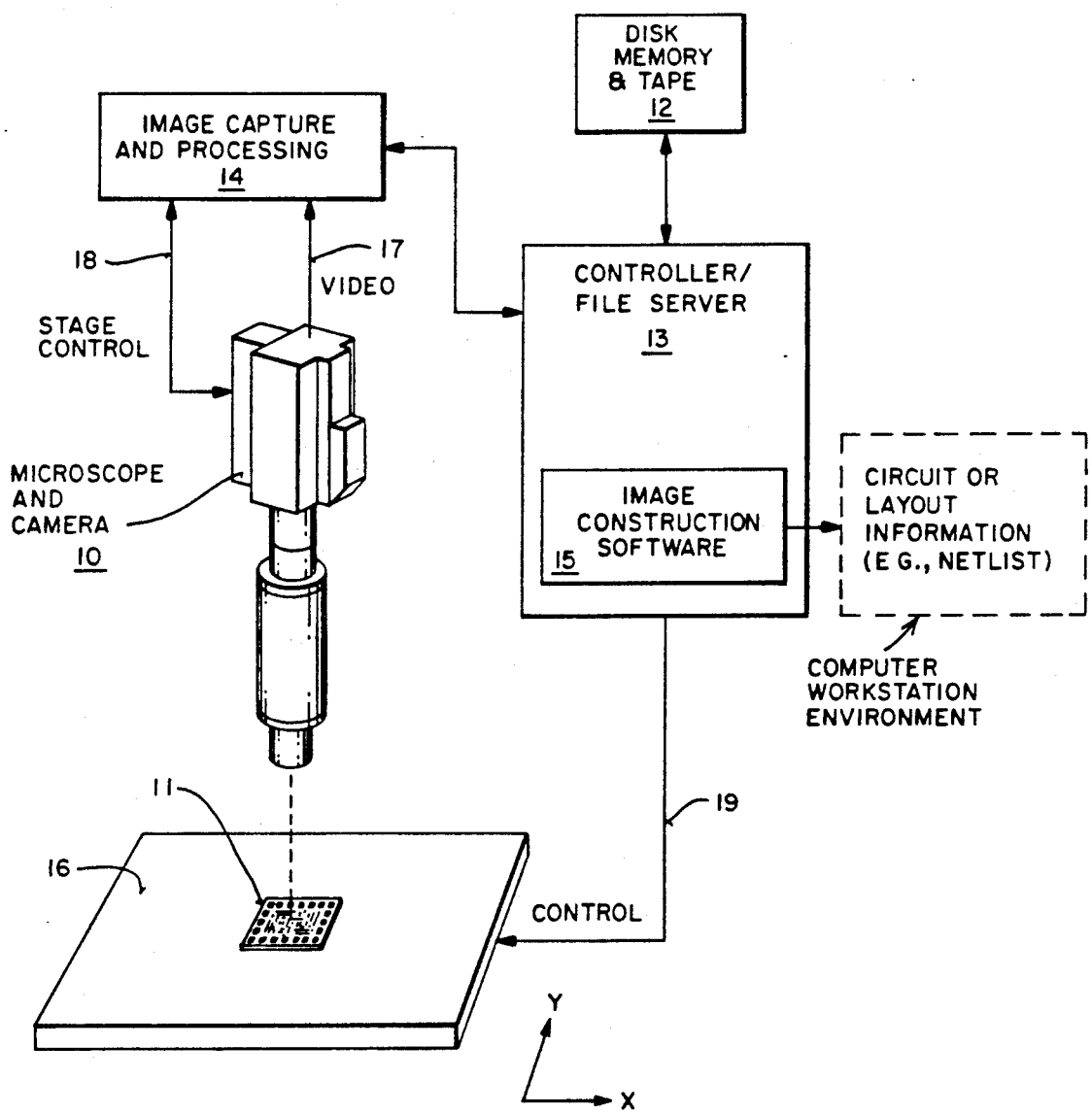

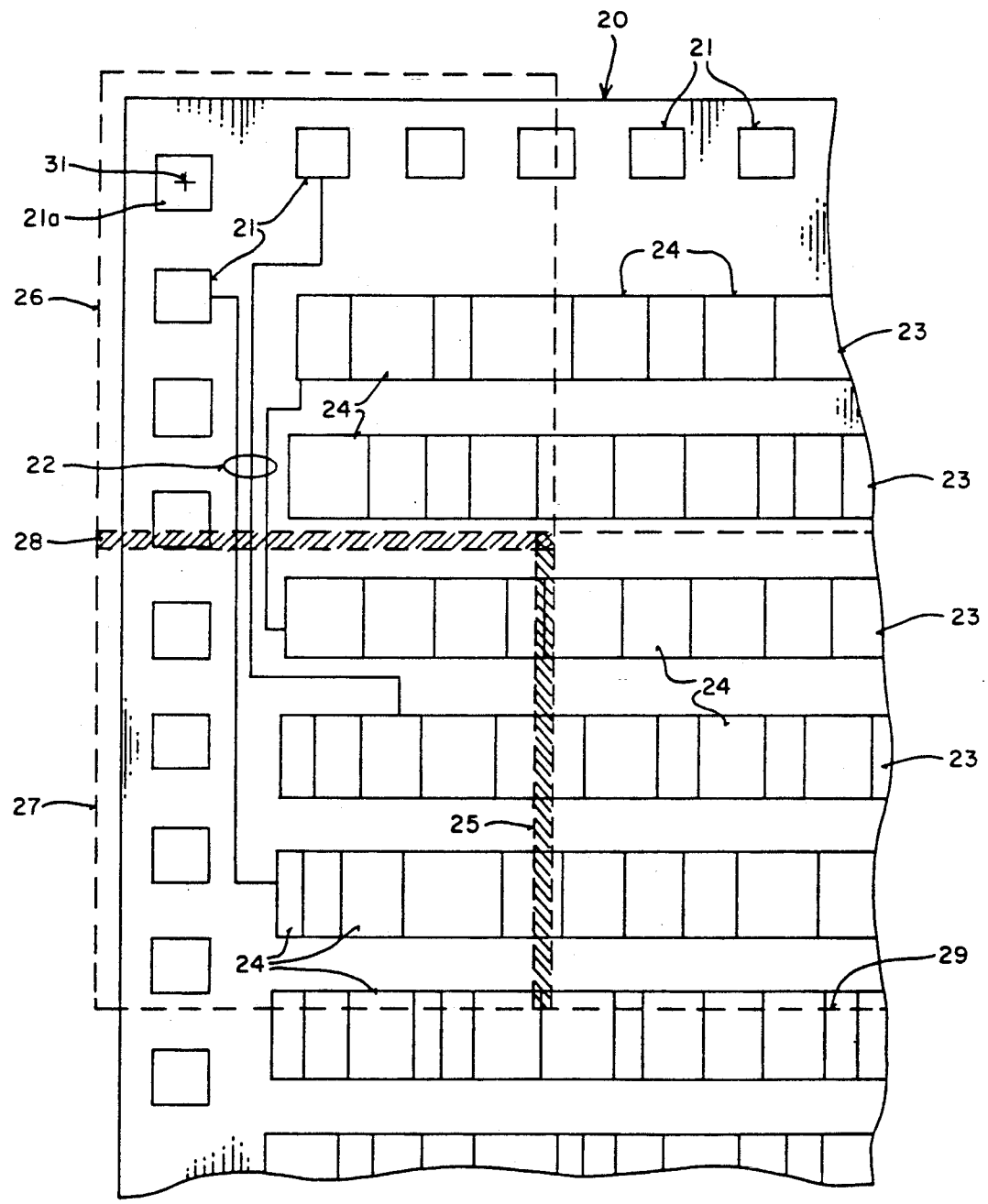
FIG_2

FIG_3
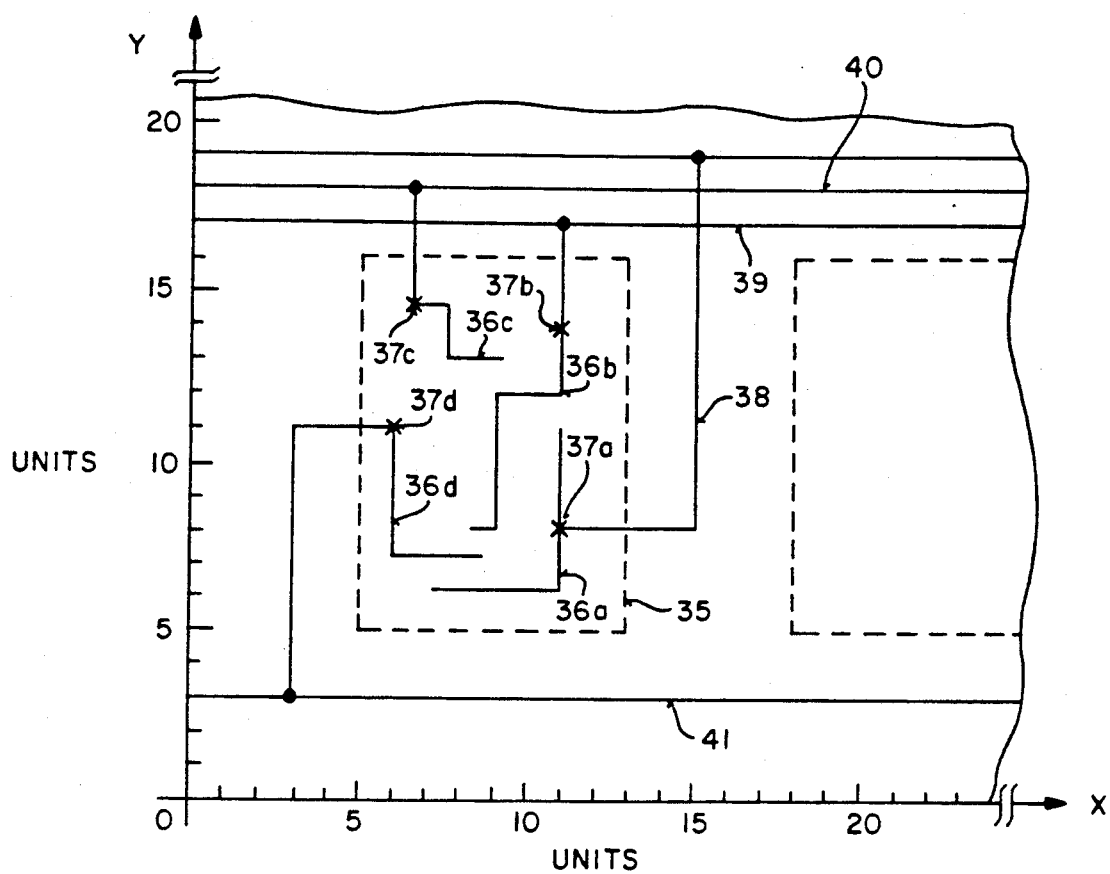
FIG_4
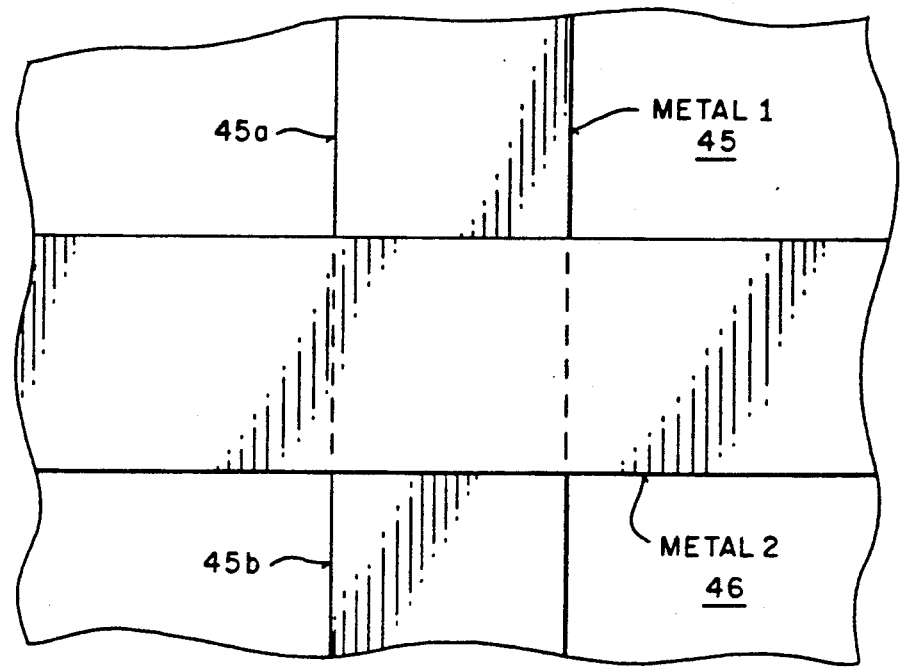

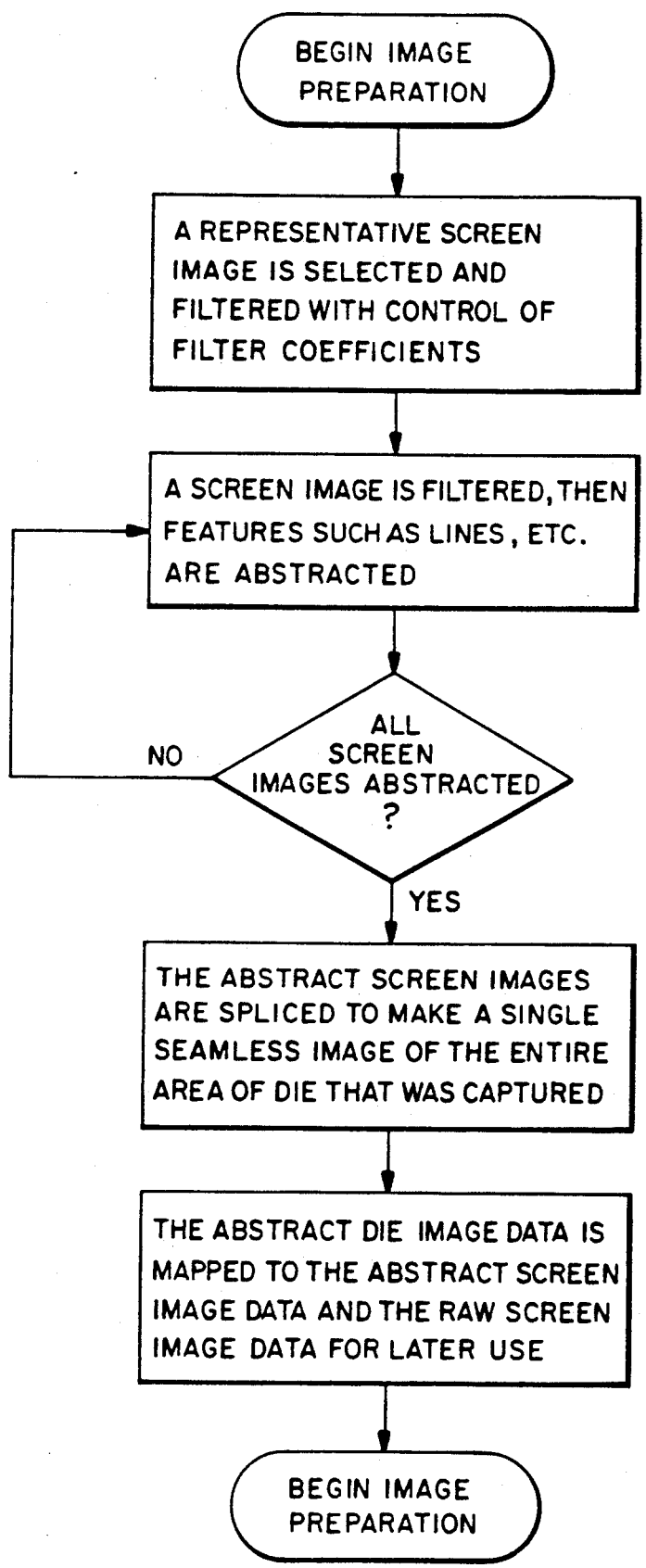
FIG_7

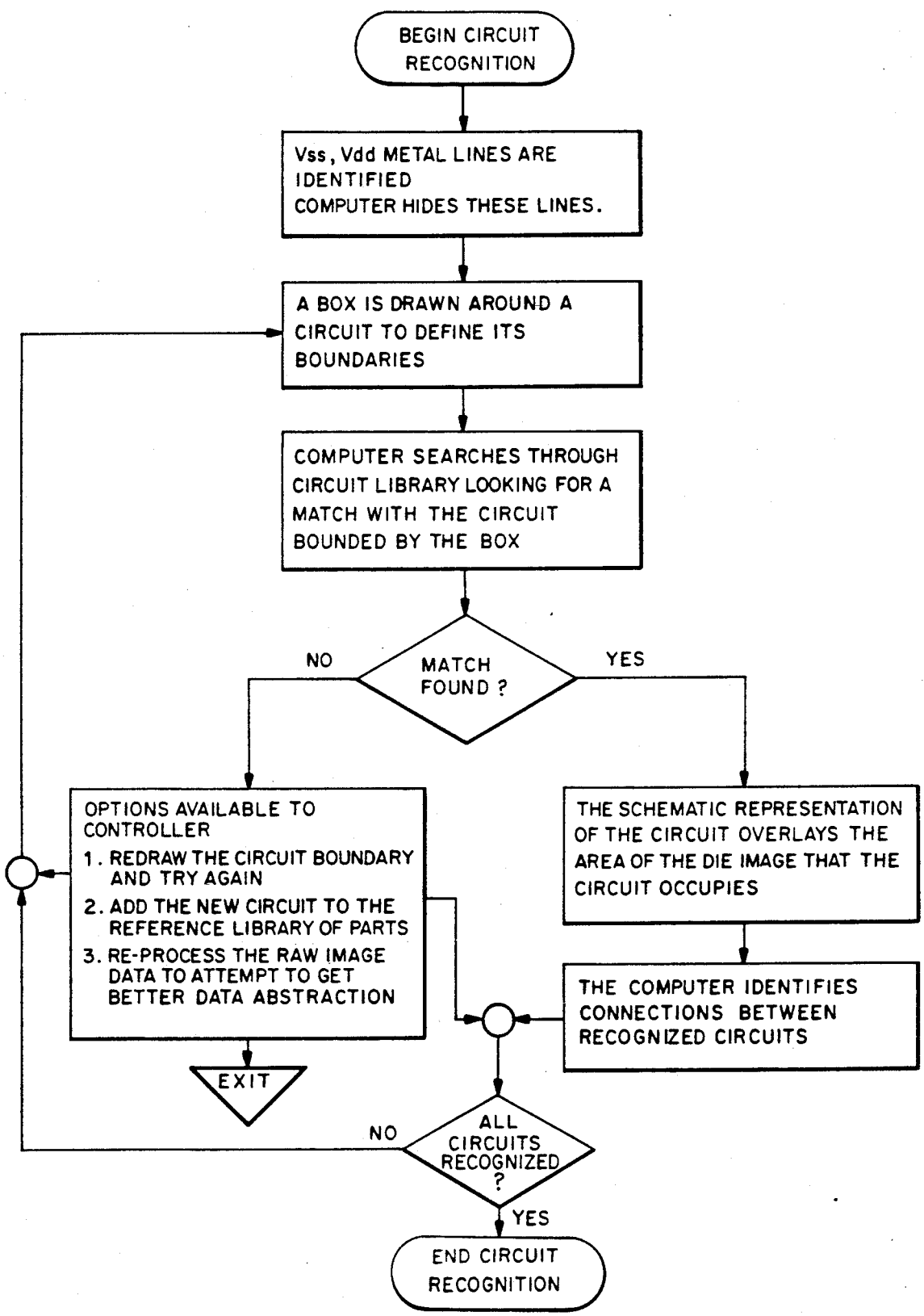

AUTOMATED SYSTEM FOR EXTRACTING DESIGN AND LAYOUT INFORMATION FROM AN INTEGRATED CIRCUIT

FIELD OF THE INVENTION

The present invention relates generally to the field of optical pattern recognition; more specifically, to methods for examining an existing integrated circuit (IC) to obtain various design and layout information, such as information pertaining to device types, connectivity, defect analysis, etc.

BACKGROUND OF THE INVENTION

Within the semiconductor industry, it is often desirable to be able to examine an existing integrated circuit (IC) to obtain design and/or layout information therefrom. By way of example, the process of designing and then successfully fabricating a large-scale semiconductor circuit frequently involves numerous iterations in which the design and/or layout of the circuit is successively modified to correct for errors in circuit design, functionality, layout connectivity, etc. In other instances, it is desirable to reverse engineer an existing IC to extract schematic or other netlist information. Both of these processes normally involve arduous, time consuming manual labor.

By way of example, the reverse engineering process typically begins by having an engineer, or one skilled in the art, visually inspect the wafer using a microscope to identify certain structures. This involves painstakingly identifying each of the various cells, logic gates (e.g., NAND, NOR, etc.) and other elements employed within the integrated circuit. Next, the engineer manually attempts to reconstruct a more complete circuit schematic by visually tracing the metal interconnections between each of the circuit elements. It is not uncommon for this type of reverse engineering task to take six months or more to complete. Thus, manual design verification and connectivity checking is one of the principle reasons why the design cycle for large scale or for very large scale integrated circuits is so exceedingly long.

Therefore, what is needed is an automated method for inspecting an integrated circuit die or wafer for the purpose of extracting design and/or layout information therefrom. As will be seen, the present invention provides an automated system for generating a netlist and other circuit information from the topological image of a fabricated chip. To achieve this, the present invention utilizes an integrated system which combines both hardware and software elements. Thus, the invented system is capable of radically reducing the cycle time for the design and fabrication of an IC, or for the reverse engineering of an existing IC. In some cases, a circuit that would normally take several months to examine and reverse engineer by hand, can be completely analyzed by the present invention in a matter of hours.

SUMMARY OF THE INVENTION

A system for extracting design information from a semiconductor integrated circuit (IC) is disclosed. In one application, the extracted information is useful in verifying the design and/or layout of partially or completely fabricated die. The same information may also be utilized efficaciously to reverse engineer an existing circuit.

In one embodiment, the system of the present invention includes an optical means for capturing the image of a section of said IC in the form of a video signal. Normally, the optical means comprises a microscope and camera assembly which is positioned directly above a table means. The table means is used for placing the integrated circuit (in the form of a wafer or die) in position for image capture by the optical means. The image capture process occurs on a section-by-section basis in which a "snapshot" of a section is obtained by the optical means, the table means stepped so that a new section is positioned under the optical means, and a snapshot of the new section obtained. This image capture operation continues until a "photographic" image of all of the sections of the die has been obtained. Central to the capture process is the fact that the table means is responsive to a control signal delivered by a microprocessor or computer, which enables the IC to be repositioned relative to the optical means. This permits a composite image of the circuit to be obtained by successive capture of contiguous or partially overlapping images covering all of the different sections of the die.

The system of the present invention also comprises an image processing means for receiving the video signal from the optical means and for generating an abstract representation of said images therefrom. The abstract representation includes lists of identifying features of each of the sections along with the relative locations of each of the identifying features. Such features frequently include the size, type and relative location of all transistors, and the width, length and relative location of all of the metal interconnects on the IC. A memory means is employed for storing the captured images, the abstract representations and also a reference library of circuit elements. The reference library of circuit elements preferably contains the raw pixel data for each of the reference circuits as well as an abstract representation in the form of descriptor lists of identifying circuit features. The reference library of circuits can be generated by collecting all of the unique and identified cells of the IC.

A computer means coupled to the image processing and memory means is also included for combining the abstract representations of the captured images to obtain the composite image of the integrated circuit. The computer means is also utilized for recognizing individual circuit cells by matching the abstract representation of a portion of the composite image with a corresponding entry in the reference library. Basically, this process is one of template matching in which a match is declared when the correlation between the respective lists of identifying features (i.e., between the lists associated with the selected portion of the composite image and those associated with a given reference library element) exceeds a predetermined threshold.

Once all of the circuit cells on the die have been recognized, the computer means then generates a more abstract schematic representation of the IC in the form of a netlist.

BRIEF DESCRIPTION OF THE DRAWINGS

For fuller understanding of the invention, reference is had to the following description taken in connection with the accompanying drawings in which like reference numerals designate like or corresponding parts throughout; wherein:

FIG. 1 is a block diagram of the design verification system of the present invention.

FIG. 2 shows the image capture process whereby the visible features of the integrated circuit are optically recorded as a plurality of sections or tiles.

FIG. 3 illustrates the grid coordinate system superimposed upon an integrated circuit in conjunction with the present invention. FIG. 3 also illustrates how templates may be constructed to represent standard cell structures appearing in the circuit.

FIG. 4 illustrates, by way of example, how inference rules may be used in accordance with the present invention to identify continuous underlying metal layers.

FIG. 7 is a detailed flow diagram of the image preparation process of the currently preferred embodiment of the present invention.

FIG. 8 is a detailed flow diagram of the circuit recognition process of the present invention.

DESCRIPTION OF THE PREFERRED EMBODIMENT(S)

Figure 5:
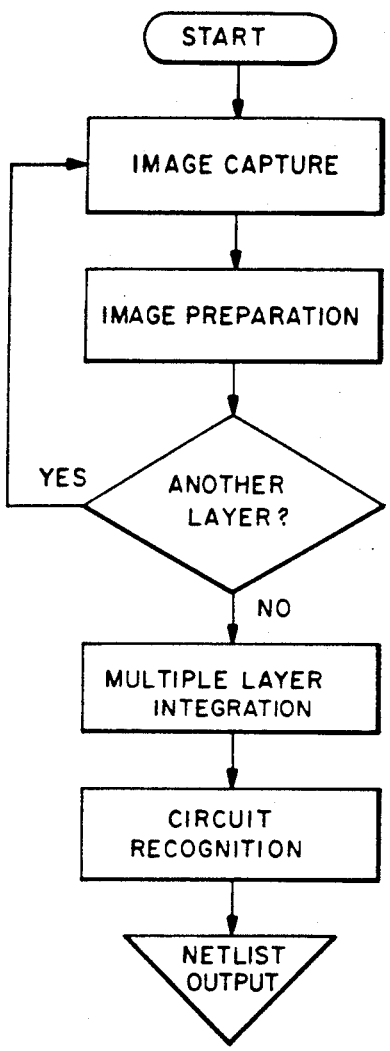
FIG. 5 is a high level flow chart which describes the present process for extracting design information from an existing integrated circuit die.

A process for extracting design information from an existing integrated circuit die or wafer is disclosed. In the following description, numerous specific details are set forth, such as specific memory sizes, dimensions, hardware, software, etc., in order to provide a thorough understanding of the present invention. It will be obvious, however, to one skilled in the art that these specific details need not be used to practice the present invention. In other instances, well-known structures and steps have been shown in block diagram or flow chart form in order to avoid unnecessarily obscuring the present invention.

An integrated circuit (IC) wafer or die is a piece of a silicon material upon which thousands of transistors and other components have been fabricated and interconnected to form a useful device. Often, it is useful to examine an IC die or wafer to obtain design or layout information. For instance, the information extracted might be a representation of the individual circuits contained in the IC along with a description of how they are interconnected (e.g., a schematic or a netlist). Perhaps a block diagram of the high level functionality of the IC is to be assembled. Normally, such information is used by a designer or IC manufacturer to verify that the part "as produced" matches the intended functionality and purpose for which it was originally designed. In other circumstances a manufacturer may use the extracted information to reverse engineer the design of another manufacturer's IC.

A semiconductor integrated circuit is invariably fabricated according to a process which builds up a sequence of layers onto the silicon substrate. With each layer, different materials are added or removed to construct the devices and elements (e.g., transistors, resistors and capacitors) that make up the circuit. For example, layers of metal are often used to interconnect the individual terminals of devices or other components. Usually, two or more metal layers are required to connect all of the components within an integrated circuit. It is the identification of these components and the connection provided by the patterned metal layers which provides the information from which the design of the integrated circuit can be reconstructed or verified.

Referring to FIG. 1, a generalized block diagram of the design verification system of the present invention is shown. The basic system includes a microscope and camera unit 10. Together they operate as an imaging device for the capture of each of the separate layers of the fabricated IC. The system of FIG. 1 also includes a disk memory 12 for storing the captured image, and an image capture and processing unit 14 for digitizing the image received from camera 10 and for performing certain image processing operations aimed at such things as contrast enhancement, reduction of stored data, etc.

The system of FIG. 1 also includes a controller/file server 13 which interfaces between the image capturing and processing unit 14, disk memory unit 12 and the computer workstation. Within controller 13 is stored the image construction software in block 15. The image construction software contains specific algorithms and routines whose purpose is to analyze the stored image and reconstruct the circuit under inspection. Control software for directing the design verification process is also resident within block 15 of the computer controller. The end result of the execution of the software routines stored in block 15 is the extracted circuit and/or layout information in the form of a schematic or netlist. This netlist information can then be utilized by other well-known software tools which run on the computer workstation. These tools facilitate the redesign or mask layout of the previously analyzed integrated circuit.

Note that in FIG. 1, the video signals produced by camera 10 are provided to image capture and processing block 14 along line 17. In turn, unit 14 provides stage control for camera 10 along line 18. As will be discussed in more detail shortly, the entire image of IC 11 is optically recorded in successive capture operations. The capture process is facilitated by placing IC 11 onto a motorized X-Y table 16. Table 16 is controlled by software resident within controller block 13. This control is illustrated in FIG. 1 as being coupled along line 19. Use of a motorized X-Y table 16 allows incremental or successive sections of the wafer or die to be scanned by the optical processing equipment. These incremental portions are reassembled later by the construction software in order to obtain a complete circuit schematic. Thus, using the image processing system of FIG. 1, along with some of the algorithmic techniques to be described shortly, the procedure of extracting design and layout information from a piece of silicon material is greatly automated, thereby shortening the reverse engineering or design cycle.

I. OVERVIEW OF THE VERIFICATION SYSTEM OF THE PRESENT INVENTION

According to the currently preferred embodiment of the present invention, the method for extracting design information from an existing IC die or wafer is described by six basic high level steps. These steps are illustrated by the flow diagram of FIG. 5. Each of these steps will now be discussed in detail.

First, a "photographic" image of one layer of the die is "captured" or input into the computer system utilizing a microscope, a television camera and a computer controlled motorized X-Y table. Note that this process may begin from completely or partially processed wafers, or decapped ICs. The ICs may be gate of the type known as array, standard cell, or full custom design circuits. The microscope or other magnifying imaging device, such as a scanning electron microscope, is connected to a controlling computer (i.e., controller 13) and also to image processing electronics circuit (i.e., unit 14).

In accordance with the preferred embodiment, image capture is performed on a section-by-section or a "tile-by-tile" basis. The entire chip image, or a major portion of the chip image, is then reassembled by "stitching" (i.e., joining) the tiles together. During this process a number of image processing operations, such as rotation correction, butt joint removal, etc., may need to be performed in order to create a seamless image of the entire integrated circuit. Processing of the assembled image can also take place at this stage to improve the resolution or contrast of the image, or to compact the data.

Next, the photographic image of the die is processed by the computer system (including the image processing routines contained in block 15) to generate another, more condensed and abstract representation of the die. This "intermediate" form of the IC image contains layout geometry information, lists of features detected, and their relative positions. These lists provide a means by which rapid and accurate identification of individual circuit cells can be performed. By way of example, the lists usually contain the types and locations of individual transistors along with the relative locations of their connecting terminals.

Because of the optical nature of the verification process, image capture and image processing for contrast enhancement, data compaction, etc., preferably takes place on a layer-by-layer basis. Since IC die fabrications often contain numerous metal layers, the layers on the top surface may partially occlude layers lying underneath. To be able to extract the necessary information from a multi-metal layer chip or die, images of each of the multiple layers must be captured. In this process the uppermost, outer layer image (e.g., metal 2) is first captured as a series of contiguous or overlapping tiles. Then one or more layers of the die are stripped back (utilizing conventional etching steps) to expose the underlying layers (e.g., metal 1, polysilicon, etc.). The underlying layers can then be captured according to the capture process outlined above. The above steps are repeated for each layer of the die that needs to be captured. In most cases, the image capture process requires capture of the metal 2, metal 1 and interconnective polysilicon layers.

After all of the layers have been captured, the intermediate representations of each layer are combined to form a single, unified intermediate image. This multiple layer integration process is handled by the computer or computer workstation which sets up a macro-coordinate system to superimpose on the chip image. The coordinate system defines an origin and the grid spacing to match the features on the IC. This gives the computer the ability to register different chip images from different layers. Definition of an origin and a grid spacing provides a means for correlating multiple levels, aligning them and registering them to each other.

Once multiple layer intergration has been completed, additional image processing algorithms are applied to identify distinct features that can be used later for circuit recognition. Existing artificial intelligence software programs are employed to examine the intermediate representation of the die and identify certain cells or circuits which are stored concurrently in a reference library. Normally, the reference library is stored in disk memory or on tape.

Alternatively, the circuit recognition process may be carried out with the aid of an engineer or operator knowledgeable in the art of semiconductor IC manufacturing. As will be discussed in more detail, this process is carried out in conjunction with the computer workstation system and the software programs resident in image construction software block 15, or in other workstations connected to block 15 (see FIG. 1). Utilizing a reference library of circuits stored either within the workstation or in disk memory 12, the computer system recognizes instances of reference library circuits identified on the die. Note that the circuits which are stored within the workstation or memory are stored in an intermediate representation—the same representation form as the reconstructed image. It is appreciated that once building block cells have been identified along with their internal components and interconnections, these distinct cells can be collected to form a cell library. Of course, a cell library can always be imported.

Whenever a circuit on the die or wafer is recognized, its intermediate representation is overlaid by a more abstract schematic representation. Connections between circuit elements are also recognized and abstracted. Each circuit is recognized in turn in this manner until all circuits and their associated connections have been processed.

To reiterate, according to the presently preferred embodiment, the circuit recognition procedure is as follows: Fundamental building block cells are extracted by comparing the single intermediate formed image of the IC with stored cell information obtained from cell libraries. The computer then instructs the image recognition electronics to scan the image in a stepwise fashion to find all identical cells. Cell coordinates and boundaries for the reference circuits are stored in the computer or in an external memory. In some instances, assistance from an operator may be necessary to identify cell types or input/output (I/O) "hit points" within the cell or along the cell boundary. (The term "hit points" refers to the predetermined locations within a standard cell at which electrical connection is made via metal 1 or metal 2 to the various terminals of the device. These hit points are typically stored along with other cell information in the cell library and are relied upon, by way of example, during automated metalization routing routines.) The above described process is then repeated until all the cells or structures within the IC have been exhausted.

The fifth major step in the design verification process involves high level circuit recognition. In this step collections of recognized circuits are abstracted to higher levels of circuit functionality. That is, software routines overlay the lower level individual circuit/connection representations with higher level circuit abstractions. Various circuit cells or blocks may be combined and recognized as, for example, an up/down counter, a multiplexer, etc. Finally, the abstracted circuit is provided as a netlist and output to the user.

II. DETAILED DESCRIPTION OF THE VERIFICATION SYSTEM OF THE PRESENT INVENTION

Now that the basic algorithm for verification of a silicon IC design has been described, the individual steps and architectural features of the present invention can be described in more detail.

Image capture begins with taking a magnified image of the wafer or die and inputting that image into a computer memory by means of a microscope and a video camera. Since the system presently relies on visible light, a standard microscope (e.g., 500X to 1000X magnification) and an ordinary imaging device such as a television or video camera may be utilized. In another embodiment, a scanning election microscope (SEM) is employed for greater magnification and resolution.

The microscope preferably has a digitally controlled stage; that is, it should be able to be controlled by a computer. A camera with a solid-state sensor is recommended because its superior geometric accuracy when compared to say, a vidicon sensor. In addition, the video camera should, for example, be able to distinguish 500 individual elements (pixels) in both the X and Y directions. This allows the creation of a 500×500 pixel matrix.

To ensure that enough detail is captured from the die, each pixel should be no more than one third of the minimum size of any feature being captured. In other words, the required pixel resolution is scaled by the minimum feature size of the target image. In the currently preferred embodiment, the classification algorithm requires a minimum of three pixels across any small region of the die. Assuming that the image is properly resolved by the microscope, a three pixel span ensures that at least one pixel will be a pure sample of the classification region. (Note that edge pixels may contain a blend of signals from the adjacent regions.)

In most cases, the image of the integrated circuit is captured in a series of individual "snapshots" or tiles, which capture a small portion of the entire die. The titles themselves are imposed by the systems optics. Thus, to capture an entire die requires that many images of different sections of the die be captured and the resulting "mosiac" of tiles be pieced together or joined to form a complete picture. In other words, the whole circuit image is reconstructed from a patchwork of "snapshots" that are stitched together along their abutting boundaries. To guarantee flawlessly reconstructed seams, the tiles should have a displacement less than the minimum feature dimension of the IC.

Referring to FIG. 2, there is shown a top view of a portion of an IC 20 upon which have been fabricated pads 21 and a plurality of standard cells 24 arranged in rows or "streets" 23. Semiconductor integrated circuits which rely upon standard cell libraries generally arrange cells in this manner. Metal lines connecting each of the cells 24 are routed in the open spaces between individual cells 24 and streets 23. A reference point or origin 31 is shown established in the center of bonding pad 21a. This origin provides a reference point for each of the tile images captured from an individual layer. It also provides a means for registering representations from different layers.

FIG. 2 also illustrates three separate tiles 26, 27 and 29 covering three different rectangular regions of circuit 20. As previously mentioned, these rectangular tile regions are superimposed by the system optics. Because of the inherent mechanical imprecision of the image capture operation, each of the tiles is intentionally overlapped with one another to a certain extent. This ensures that no portion of the die will escape image capture. By way of example, in FIG. 2 the overlap between tile 26 and tile 27 is shown by the cross hatched region 28. Likewise, the overlap between tiles 27 and 29 is shown by the cross hatched region 25. The overlap of tiles 29 and 26 is represented by the intersection of regions 28 and 25.

Figure 6:
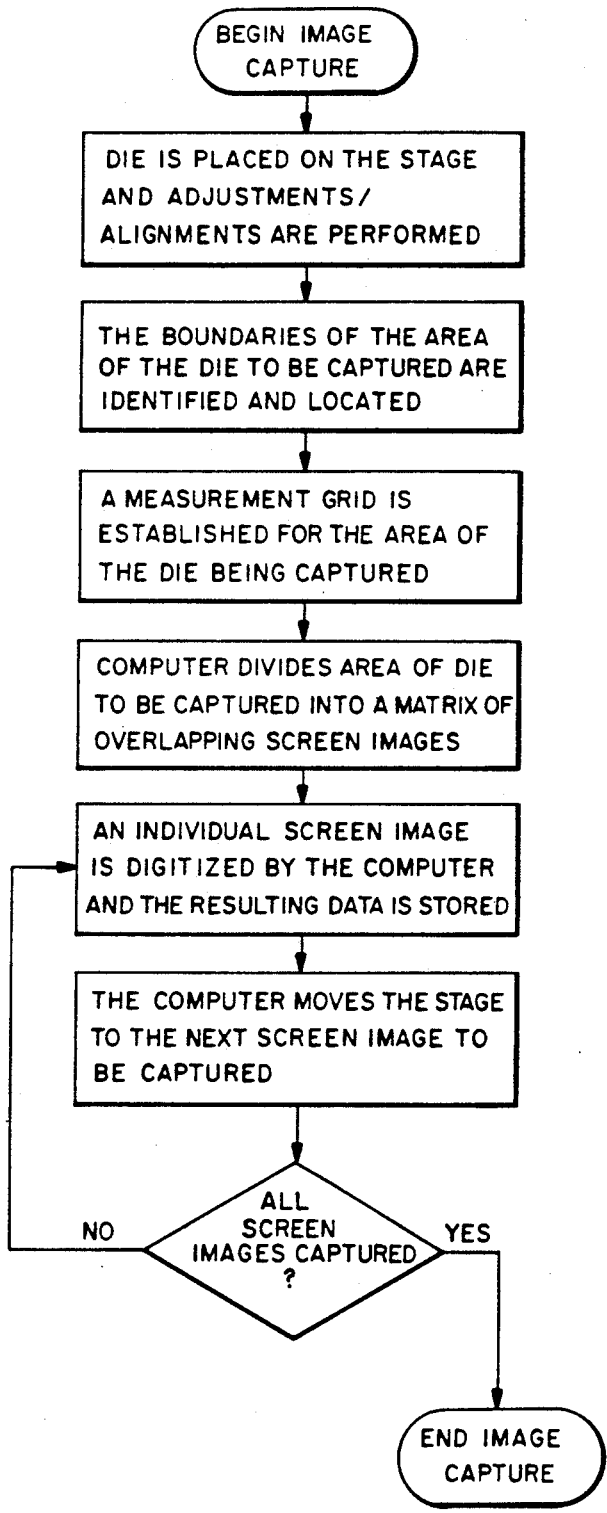
FIG. 6 is a detailed flow diagram of the image capture process of the currently preferred embodiment of the present invention.

With reference now to FIG. 6, the detailed steps involved in image capture of a single layer are as follows: First, the operator mounts the die or wafer onto motorized X-Y table 16 (see FIG. 1). The camera or table is then rotated to align the X-Y axes of the die with the X-Y axes of table 16. This operation may be carried out via a feedback loop in the electro-optical path comprising microscope and camera 10, image capture and processing unit 14 and the controlling processor (i.e., controller 13). As will be explained shortly, unit 14 typically contains vision software capable of seaching for multiple die patterns to determine the X-Y position and angle of the wafer or die. The search closes the feedback loop by determining the position of a reference point on the die and then tranferring that information to the positioning controller. Usually the vision system can maximize angular accuracy by searching for the X-Y positions of two points on the wafer or die, and then calculating the angle between them.

Alternatively, an operator may achieve the same result manually. That is, while the operator views the magnified image on the image processing computer screen, he or she manually rotates the die by a theta adjustment on the stage so that the X-Y axes are roughly aligned with the X-Y axes of table 16. In the process, the operator may also adjust the microscope and camera 10 focus, the light source, etc., so that a clear, sharp image is received.

Once the die is mounted on the X-Y table, the image capturing processing software performs a correlation search over the geometric features of the die to locate a fiducial (or other alignment target pattern) near the corner of the die. Obviously, this referencing step may also be performed by hand. For this situation, the operator, while viewing the image of the die on the computer screen, directs the computer to move the motorized X-Y table 16 such that the upper left-hand corner of the die area to be captured is first located. A "crosshair" pattern superimposed on the computer screen is utilized to precisely locate this boundary on some recognizable feature of the die (e.g., fiducials, alignment marks, bonding pads, etc.). This feature should be present even after several layers are stripped back. This location and the captured image of the screen (including the crosshairs) are saved to aid in identifying this same position on an underlying layer to be captured at a later time. For the example provided in FIG. 2 the center 31 of bonding pad 21a is utilized as a reference mark to begin capture on a tile-by-tile basis. Bonding pads are very useful reference marks since the center can be easily located and registered through multiple layers of the fabrication process.

After one corner of the die has been located and recorded along with its reference mark. An opposite corner (e.g., the lower right-hand corner) of the die is located and similarly recorded. The computer is then instructed to capture the entire image in the bounded area as a sequential series of tiles. An algorithm implemented within software block 15 estimates the number of snapshots required along each axis for image capture and automatically "steps" or moves the X-Y table to each snapshot location to capture the individual images or tiles. A suitable amount of overlap between the adjacent images is planned for to aid in "piecing" together the entire image and to allow for inaccuracies in the positioning of the X-Y table. By way of example, in the currently preferred embodiment of the present invention a tile size of 200×200 microns is typical.

It is appreciated that captured tile images may end up being stored in memory 12 with a slight rotation or some other inaccuracy due to the electro-optical-mechanical nature of the verification system. For instance, it is not uncommon to have slight problems of alignment, tiles, rotation, focus and/or scaling magnification problems. These problems can be addressed at this point in the process by the image capturing processing unit 14.

Unit 14 preferably comprises two basic elements: vision hardware and vision software. The vision hardware portion comprises a standard microprocessor to provide stage control to microscope and camera 10 along line 18. The microprocessor may also control other elements of the automated system.

The vision hardware further includes an image digitizer—frequently referred to as a frame grabber for capturing images at high resolution. From the analog video camera signal on line 17, the image digitizer produces a digital image containing 576×448 picture elements or pixels in the presently preferred embodiment. Each pixel in the image is 6 bits deep, meaning that its intensity can be any of 64 shades of gray. The hardware portion of unit 14 may also include some non-volatile random-access memory (RAM) for preserving important data or for storing application programs. This internal RAM may also be used for other image processing functions, such as contrast enhancement, or for data compaction. Currently, image capture and processing unit 14 comprises a Cognex 3000 series vision system, manufactured by Cognex Corporation of Needham, Mass.

The vision software portion of unit 14 comprises a library of software tools for acquiring and manipulating the raw video images. These tools may include programs to locate objects and accurately measure their positions and orientations. In most cases, there are included tools for extracting measurements from a located object, such as its area, dimensions and center of mass. Other programs may be utilized for alignment of the semiconductor die to be inspected and for correcting problems of rotation, scaling magnification, etc.

It should be understood that, in general, the requirements of the image capture and processing unit 14 are determined by the specific operations to be performed. For example, in most instances, the amount of data processed from the tile images will be quite large. Therefore, image capture and processing unit 14 preferably should have a large RAM image buffer, and should have fast disk access capability (via controller/file server 13). The system should also be capable of remotely controlling the microscope and camera stage.

The memory size requirements of memory 12 are matched to the requirements of the image processing subsystem and the anticipated complexity of the integrated circuit to be inspected. For most applications, the memory size requirement is determined by the minimum feature dimension and the maximum chip size. Preferably, each pixel requires 3 bytes; that is, 8 bits for each of the primary colors. This requirement can be described mathematically by the following equation:

$$M = 3*(9*CA)/(CD^2)$$

where M is the memory size in bits, CA represents the chip area, and CD is the minimum feature dimension. For example, a one square centimeter circuit having a one micrometer feature requires 270 megabytes of memory. This need is easily satisfied with a conventional hard disk drive memory. In other implementations it might be useful to include a tape drive or some other mass storage medium (e.g., optical disk) as part of memory unit 12.

Once the computer divides the area of the die to be captured into a matrix of overlapping screen images (i.e., tiles), the actual image capture process may proceed. That is, individual screen images or tiles are digitized by the microprocessor in unit 14 and the resulting pixel data stored in memory 12. The microscope and camera 10 is then instructed by the processor to move to the next screen image to be captured and the process of digitization is repeated. This continues until all of the screen images within the boundary areas established by the measurement grid are captured.

After all of the "pieces" of the image layer are captured, a single composite image is then constructed. This is the primary function of the image construction software in block 15. Each tile or piece of the image must be positioned with respect to its neighboring tiles or images such that lines and features of the boundaries of adjacent tiles match up.

According to the verification system of the present invention, this function is performed automatically utilizing image processing algorithms. As a by-product, a more abstract "intermediate representation" of the captured image is produced. Both the original pixel representation "pieces" of the image, and the composite intermediate representation of the image are correlated and maintained for future use. The detailed steps involved in preparing the image of a layer are described by the flow chart of FIG. 7.

To begin with, a representative screen image is selected by the computer system. Of course, manually selection is also possible wherein an operator visually scans the captured images until a suitable region is found. Ideally, the representative screen image selected should be densely packed with circuitry.

The selected image region or tile is then subjected to image processing/filtering algorithms to produce an enhanced image which can be displayed on a CRT monitor along side the original image. Usually, the image is enhanced to provide greater contrast between different fabrication layers (e.g., between metal 1 and metal 2). This processing/filtering step may be iterated—each time varying the filter coefficients—until a suitably enhanced image is obtained. The resultant coefficients are retained for application to the remainder of the tiles or regions of the image. It should be apparent that this particular phase of the verification process is important because different layers of the die may require different filter coefficients.

To be able to match features between adjacent tiles, the features of each image must be identified. This identification/transformation process is performed by image processing algorithms within the computer which yield a representation of the image in terms of its features (i.e., lines, rectangles, etc.), their sizes, endpoints, and relative positions. The result is termed the intermediate representation of the image. The computer then builds a composite image of the intermediate representation of the single layer by matching the features at the boundaries of adjacent pieces. The pixel pieces are then correlated with the composite intermediate representation for that layer and both are saved for later use in memory 12.

Consider the example provided by FIG. 2. In FIG. 2, there is shown a plurality of metal lines 22 which interconnect various circuit elements located in tiles 26 and 27. During the image preparation process, each of the lines 22 is first identified in terms of its coordinate features. Note at this point some data compaction may be performed in order to reduce the memory storage requirements. For instance, rather then storing every pixel of each line segment, it is preferable to store the starting and end point locations and the length of the connecting straight-line metal segment.

Once the intermediate representation of an image tile is generated, the features appearing at the boundaries of adjacent pieces are matched. For the case of FIG. 2, this would involve matching each of the metal lines 22 appearing at the boundary of tile 26 with the corresponding metal line segments present along the boundary of image tile 27. Because each of the metal lines 22 are found in the overlap region 28, correlation is facilitated.

After the entire image layer has been captured and prepared, the wafer or die is subjected to an ordinary etching sequence to remove the uppermost, most recently captured layer. This exposes the next underlying layer of the substrate. For most circuits the first layers captured will be metal 2 (i.e., the second metalization layer). This means that the protective passivation layer and the uppermost metalization layer (e.g., metal 2) must both be etched away to expose the underlying metal 1 layer. The image capture and image preparation steps described above are then repeated for the next layer in the sequence (e.g., metal 1).

Note that in some instances the etching step is obviated by careful manipulation of the filter coefficients. By way of example, in those situations in which metal 2 does not completely cover the surface of the substrate, the image may be selectively filtered to develop or contrast with the underlying metal layer (e.g., metal 1). Fourier analysis is also useful in conjunction with well-known inference rules to determine the connectivity of an underlying metal 1 layer.

FIG. 4 illustrates a commonly encountered situation in which inference rules are valuable in determining the connectivity of an underlying metal 1 line partially occluded by an upper metal 2 trace. In FIG. 4, metal 2 line 46 is shown extending in a horizontal direction over vertical metal 1 line 45. Utilizing Fourier analysis, the system of the present invention can identify the locations of sections 45a and 45b relative to the overlying metal 2 trace 46. Analogous to the situation wherein features are matched at the boundaries of adjacent tiles, the system infers that section 45a of metal line 45 is electrically connected to section 45b. Basically, the system matches the features at the region boundary defined by metal line 46 and assumes a logical connection.

Once intermediate representations of all of the relevant layers have been assembled, the system proceeds with multiple layer integration and feature extraction. In this step, each layer that has been captured must be precisely aligned to all of the other layers such that when the captured layers are superimposed, an accurate representation is obtained. A key to this alignment process is the precise location of the upper left and lower right boundaries of the area to be captured for each layer.

When the second and subsequent layers of the die are being aligned to these boundaries, the computerized verification system superimposes the alignment images from the top layer onto the current layer screen image as an aid. This alignment image (along with original "crosshair pattern") presently appears on the screen of the computer workstation in a different color than the actual image being obtained via the camera/microscope arrangement. The computer is then commanded to move X-Y table 16 so that the boundary point appears on the current layer screen. The alignment process is completed by moving the alignment image crosshairs over the point of the boundary of the actual image. As stated previously, this step may be performed automatically or through operator assistance. Often, the center of a bonding pad located in the upper left and lower right hand corners of the die is useful in establishing a reference point for alignment of layers. Dedicated alignment marks or fiducials can also serve the same purpose.

It should be apparent that an important aspect of the present invention is the establishment of a macro-coordinate system for the die under inspection. This involves defining an origin along with a grid coordinate system. The actual grid spacing can be elastic in that one grid unit may be defined in terms of pitch spacings or some other feature of the die. Normally, pitch is defined as the minimum metal line width which can be printed in the fabrication process plus the minimum metal-to-metal spacing. Preferably, one grid line spacing unit is defined as one metal pitch (either metal 1 or metal 2, whichever is smallest). Thus, superimposing a grid coordinate system along with an origin over the intermediate representation of the die provides a means of registering each of the intermediate representations of each layer.

After all of the layers are captured and converted into an intermediate form, the intermediate representations are combined.

Working from the combined intermediate representation, sets of features to be used to guide automatic circuit identification are tagged. Rather than utilize all of the separate features for automatic circuit identification (i.e., lines, rectangles, intersections, etc.), a small set or subset of "identification (ID) features" which most often can uniquely identify a circuit are tagged. For example, all inter-metal layer connection points (i.e., vias) may be used for this purpose. Practically, the user or programmer is able to preselect which features are to be used from a handful of types or features.

During the tagging step, distances to neighboring ID features are also calculated. It is the relative location of these ID features that form the basis of the pattern matching that is required to automatically identify circuits. Note that in some cases, the ID features selected will not resolve ambiguities between potential matching circuits. In this case, a second or additional set of ID features is generated based on the distinguishing feature types. This second or expanded set of ID features is then used to narrow the list of potential matching circuits.

Referring now to FIG. 8, there is shown a flow diagram of the circuit recognition phase of the design verification process of the present invention. Circuit recognition is the process of matching small portions of the intermediate representation of the die to one of many "circuit templates" contained in the reference library. The reference library of standard cell structures or other circuits is usually stored within memory 12. Alternatively, a reference library can be constructed as a consequence of the recognition process. In other words, every time a unique cell instance is recognized for the die under inspection, it is classified and entered into the library. If another instance of the same cell appears later on, a match is declared.

Note that the reference library contains essentially the same information as the intermediate representation of the die, including sets of precompiled identification features. In addition, the reference circuits stored in the library also contain a schematic of the circuit and corresponding identification labels or names along with the locations of the connections to each of those elements. A simple example is an inverter in which the input and output lines are identified as such and are labeled along with the locations of each of the respective external connections.

Even though at this point the intermediate representation of the die has been reduced to a fairly small set of identification features, examining sets of identification features across the die and comparing them to entries in the reference library would most likely take excessive processing time. Mainly because of this reason, circuit extraction is preferably operator directed.

To better understand how a reference library of circuits may be used to identify standard cells according to their intermediate representations, consider the example shown in FIG. 3. FIG. 3 illustrates a simple intermediate representation of a standard cell which has been included in IC 20. The standard cell ID features contained within boundary 35 include length with distance information associated with internal lines 36a through 36d, and their relative positions with reference to one another. As shown, each of the internal metal lines 36a-36d is connected to corresponding external metal lines 38 through 41, respectively. The connections are made at hit points (marked by an "X") 37a through 37d, respectively. Note that the reference circuit library internal representation for the cell of FIG. 3 would contain the same list of ID features mentioned above. That is, the library cell includes information about the location of boundary 35, the length, width and relative distance between each of metal lines 36a through 36d, and hit point locations 37a through 37d.

As part of the circuit recognition process the computer system scans the portion of die 20 shown in the illustration of FIG. 3 in an attempt to match its internal representation to one of the reference library circuits utilizing the sets of precompiled ID features. Essentially, the process is one of template matching, wherein individual circuit cells from the reference library are compared to the internal representation of the die area selected. Thresholding techniques are used to determine when a match exists.

By way of example, for the circuit section of FIG. 3 the reference circuit representation for the cell within boundary 35 contains, at a minimum, the descriptor information associated with metal lines 36a through 36d and hit points 37a through 37d. However, the reference circuit representation would not contain any information about the portion of metal extending from lines 38 through 41 which is within boundary 35. These portions are external metal lines. In other words, the stored representation does not contain information about how the cell is connected externally to its hit points. Thus, a 100% match is rarely achieved.

Instead, a match is declared when a template comparison between the selected portion of die 20 and the reference library circuit exceeds a certain predetermined threshold (e.g., 95%). Of course, an alternative method is to allow the computer to match the internal representation of one cell with all other possible cell locations on the chip. In this way, the computer can create its own internal cell library while it is attempting to match identical cells. Having a reference cell library stored in memory 12 greatly speeds up the process of circuit recognition.

The process of circuit recognition is further facilitated by defining a searching boundary. The most obvious choice for a search boundary is along the well defined streets of cells laid out across the die. A reduction in search time can be realized by providing a fixed stepping distance, whereby the computer steps a predetermined number of grid coordinate system units along the street or row. Ideally, the stepping distance should be related to the most likely standard cell size (i.e., width). This type of search algorithm is most useful in gate array type circuits.

Once cells have been properly identified, the computer stores the cell's coordinate information and also references the cell's relative location within die 20. It is appreciated that the process of identifying all, or a statistically significant number, of the cells located on the IC may require several iterations of the above-described recognition process.

The flow chart of FIG. 8 illustrates an alternative embodiment in which the circuit recognition process is accelerated with the assistance of a trained operator. According to FIG. 8, the operator first identifies the metal lines on the intermediate representation that are used to conduct power to the circuits. Commonly, these include the $V_{SS}$ and $V_{DD}$ lines. Note that these metal lines may be "hidden" from the intermediate representation provided to the operator in order to make the pattern recognition process easier. (This also may be the case when the recognition process is performed automatically by the computer.) An important consequence of removing or hiding the power lines from the operator's view is that any metal lines that may have been occluded by the $V_{SS}/V_{DD}$ lines can now be seen more clearly.

Next, for each circuit representation to be identified the operator first examines the intermediate representation of the die. Then, using a mouse, or some other input device, the operator draws a box or boundary around the circuit. The computer then searches through its reference circuit library looking for a circuit or cell that matches the operator-defined boundary region. As mentioned before, the stored reference circuit representation does not contain metal lines that cross the circuit boundary, since these are external metal lines only. Therefore, to speed up the identification process the computer preferably eliminates from view all of the metal lines crossing the operator-defined boundary on die 20. This removes any intermediate representation components that are not part of the circuit to be recognized. An additional benefit is that the metal layers which were underneath these upper metal lines are now exposed to full view.

After all extraneous metal has been removed from the visual field, the operator directs the computer to attempt a circuit identification by specifying one of three types searches to be performed. These searches are based on the relative size of the outlined circuit and the particular reference circuit specified. Most often, the operator will specify a "same size" search wherein the computer searches for a reference circuit that is about the same size as the outlined area. Another option available to the operator is to specify a "macro" search, wherein the computer looks for an instance of the outlined circuit in the same or larger circuits. In a "micro" search the computer examines portions of the outlined circuit trying to determine whether reference circuits of the same or smaller size match that area. It is appreciated that the amount of time required for circuit identification may increase dramatically when either the macro or micro search methods are invoked.

If the computer finds a match which exceeds a predetermined threshold level, a successful match status is reported and the circuit template from the reference library is currently displayed in a window adjacent to the outline of the circuit area defined by the operator. The operator is then prompted whether he or she wishes to accept the computer's identification. If the operator accepts the identification, the reference circuit is automatically overlaid on top of the intermediate representation of the pertinent portion of the operator-defined region. A component of the output netlist is then built. At this point in the process signal lines may be identified and labeled.

If the operator rejects the identification, the search continues through the remaining reference library cells. Note that during the search operation, all forms of the reference circuit are examined. That is, the system examines rotated images, mirror images, etc., of the stored reference circuit against the internal representation extracted from the die.

In the event that the computer does not find a match which exceeds the predetermined matching threshold level, the operator has several options. First, the operator can redraw the boundaries of the circuit and try again. Another possibility is that the operator can manually scan through the reference library circuits using another display screen window which can be opened adjacent to the outlined circuit. The operator can then proceed to find the most likely candidate by "forcing" a match on specific reference circuits.

Yet another possibility is that the operator may use the outlined circuit to identify a new reference library circuit element. Schematic capture for this new circuit can then be performed utilizing a commercially available schematic capture program. Recognize that the operator always has the option of lowering the threshold level until an appropriate match is found. This may be required whenever the bounded area defined by the operator is relatively large.

Still another alternative available to the operator is to elect to examine the raw "pixel" image of the area defined by the outline circuit, and then reproduce the intermediate representation of that area using different filter coefficients. This approach might provide better contrast between fabricated layers, thereby helping the identification and matching process.

As an option of last resort, the operator can simply identify the circuit as a "black box" element and label the connections appropriately. This approach is most useful for filling in "holes", or otherwise unidentified regions, when generating schematics for circuits that have not been completely recognized, or which do not contain standard cell or gate array type geometries. Often times, viewing a "black box" in circuit context helps to identify its circuit functionality.

The circuit identification procedure continues until all of the circuits on the die or wafer have been recognized. Moreover, when two interconnected circuits are recognized, the interconnecting lines are automatically identified as being a single line by the computer. At this point, the operator may wish to specify a particular signal name for the line, or, invoke a design rule checking algorithm. Once all cells have been identified, the remaining metal lines (i.e., those lines interconnecting each of the individual cells) are identified in terms of their location, length, distance, etc. This connective information is then used in creating high level circuit abstractions and, ultimately, in the generation of the netlist output.

After a group of connected circuits have been converted from intermediate form to schematic form, the design verification system begins apprehending the higher level functionality in these circuits. For example, a collection of logic gates may be identified as comprising a flip-flop or some sort of state machine. The process is one of matching collections of schematic representations. Alternatively, an operator can overlay the schematics of the groups of cells with a higher circuit representation obtained from the reference library. The operator may also wish to overlay a circuit of the operator's own design. As before, the operator visually determines when a match exists. Once again, schematics not included in the library may be generated using well-known schematic capture tools.

There are two important outputs of image construction software block 15. One is the design information in the form of a schematic netlist as described above. The other important output is the layout data provided on a layer-by-layer basis. Although the two are related, each may be utilized separately for different purposes depending on the application. For instance, a netlist is valuable in analyzing a circuit or for routing metal lines as part of a separate design. This information is most useful when reverse engineering an existing IC. For someone who is interested in design verification, connectivity checking or for debugging purposes, the layout information may prove more helpful. Furthermore, having the layout information available means that the cell images can be examined on a layer-by-layer basis.

Thus, an automated system for extracting design and layout information from an integrated circuit has been described.

What is claimed:

1. A system for extracting design information from a semiconductor integrated circuit (IC) comprising:
   means for capturing the image of a section of said IC in the form of a video signal;
   table means for placing said IC in position for image capture of said section by said capture means, said table means being responsive to a control signal to enable said IC to be repositioned relative to said capture means such that a composite image of said IC can be obtained by successive capture of partially contiguous or overlapping images covering all of the different sections of said IC;
   image processing means for receiving said video signal and for generating an abstract representation of said images, said abstract representation including lists of identifying features of each of said sections and the relative locations of said identifying features;

memory means for storing said images, said abstract representations and a reference library of circuit elements;

computer means coupled to said image processing and memory means for combining said abstract representations of said images to obtain said composite image, and for recognizing individual circuit cells by matching the abstract representation of a portion of said composite image with a corresponding entry in said reference library;

once all of said circuit cells on said IC have been recognized, said computer means generating a schematic representation of said IC in the form of a netlist.

2. The system of claim 1 wherein said composite image contains abstract representations extracted from multiple fabrication layers of said IC.

3. The system of claim 2 wherein said computer system further comprises a means for correlating said multiple layers and for registering them to each other.

4. The system of claim 3 wherein said correlation means comprises a grid coordinate system overlaid over said composite image and referenced to a point of origin which is identically located on each of said multiple layers.

5. The system of claim 4 wherein said computer means provides said control signal to said table means during image capture.

6. The system of claim 5 wherein said table means comprises a motorized X-Y table.

7. The system of claim 3 wherein said capture means comprises a microscope and video camera mechanism.

8. The system of claim 7 wherein said image processing means is capable of operating on said video signal to enhance the contrast between said multiple layers of said IC.

9. The system of claim 8 wherein said computer means builds said composite image by matching said identifying features at the boundaries of adjacent sections of said partially overlapping images for each of said multiple layers of said IC.

10. The system of claim 9 wherein said image processing means comprises a digitizer for producing a digital image from said video signal.

11. The system of claim 10 wherein each pixel of said digital image contains information from no more than one third of the minimum size of any feature being captured on said IC.

12. The system of claim 11 wherein said microscope and camera mechanism has a resolution capable of distinguishing 500 individual pixels in both the X and Y directions.

13. A system for extracting design information from a semiconductor integrated circuit (IC) comprising:

optical means for capturing the image of a section of said IC in the form of a video signal;

table means for placing said IC in position for image capture of said section by said optical means, said table means being responsive to a control signal to enable said IC to be positioned relative to said optical means such that a composite image of said IC can be obtained by successive capture of contiguous or partially overlapping images covering all of the different sections of said IC;

image processing means for receiving said video signal and for generating an abstract representation of said images, said abstract representation including lists of identifying features of each of said sections and the relative locations of said identifying features;

memory means for storing said images, said abstract representations and a reference library of circuit elements;

computer means coupled to said image processing and memory means for combining said abstract representations of said images to obtain said composite image, and for recognizing individual circuit cells by using their abstract representations to identify circuit components within said cells and to decipher their interconnections therefrom, each of said recognized cells being input into said reference library for subsequent recognition of other instances of said cells;

once all of said circuit cells on said IC have been recognized, said computer means generating a schematic representation of said IC in the form of a netlist.

14. The system of claim 13 wherein said composite image contains abstract representations extracted from multiple fabrication layers of said IC.

15. The system of claim 14 wherein said computer system further comprises a means for correlating said multiple layers and for registering them to each other.

16. The system of claim 15 wherein said correlation means comprises a grid coordinate system overlaid over said composite image and referenced to a point of origin which is identically located on each of said multiple layers.

17. The system of claim 16 wherein said computer means provides said control signal to said table means during image capture.

18. The system of claim 17 wherein said table means comprises a motorized X-Y table.

19. The system of claim 18 wherein said optical means comprises a microscope and video camera mechanism.

20. The system of claim 16 wherein said image processing means is capable of operating on said video signal to enhance the contrast between said multiple layers of said IC.

21. The system of claim 20 wherein said computer means builds said composite image by matching said identifying features at the boundaries of adjacent sections of said contiguous or partially overlapping images for each layer of said IC.

22. The system of claim 21 wherein said image processing means comprises a digitizer for producing a digital image from said video signal.

23. The system of claim 22 wherein each pixel of said digital image contains information from no more than one third of the minimum size of any feature being captured on said IC.

24. The system of claim 23 wherein said microscope and camera mechanism is able to distinguish 500 individual pixels in both the X and Y directions.

25. In a computer system capable of receiving and processing video signals, a process for extracting design information from an integrated circuit (IC) comprising the steps of:

capturing an image of said IC by successively scanning each of a plurality of physical layers which comprise said IC utilizing a microscope and video camera;

storing said image in a memory within said computer system;

processing said image to generate a condensed and abstract representation of said IC, said abstract representation containing lists of physical features detected in said image and their relative positions, said physical features including the geometric shapes and dimensions of various components which comprise individual circuit elements of said IC, said processing step including the step of filtering said image to distinguish said physical features from background information;

recognizing said individual circuit elements present in said IC by comparing said abstract representation with a reference library of circuits stored in a similarly abstract form utilizing said computer system;

determining the connections between said circuit elements:

cataloguing said connections in the form of a netlist:

abstracting groups of said circuit elements and their associated connections into a logical representation indicative of the functionality of said circuit elements and their associated connections.

26. The process according to claim 25 wherein said memory comprises a magnetic disk drive recording system.

27. In a computer system capable of receiving and processing video signals, a process for extracting design information from an integrated circuit (IC) comprising the steps of:

(a) inputting a magnified image of one layer of said IC into said computer system by successively capturing tiled images of all of the various sections of said IC;

(b) processing said magnified image of said one layer to generate an abstract representation of said IC, said abstract representation including lists of features detected in said image and their relative positions, said lists providing a means by which individual circuit cells can be identified;

(c) repeating steps (a) and (b) until all layers necessary for circuit recognition have been captured;

(d) combining the abstract representations associated with each of said layers to form a single intermediate representation of said IC;

(e) utilizing a reference library of circuits stored in an intermediate representation within said computer system to recognize instances of said circuits on said IC;

(f) overlaying said recognized instances with schematic representations of said circuits;

(g) repeating steps (e) and (f) until all circuit elements on said IC and their associated connections have been processed;

(h) optionally overlaying the schematics of groups of connected circuit elements with a high level circuit representation indicative of the functionality of said connected elements; and (i) outputting a schematic netlist of said IC.

28. The process according to claim 27 wherein said tiled images of said sections partially overlap one another to ensure complete image capture of said IC.

29. The process according to claim 28 wherein said lists of features include the dimensions and relative location of transistors, and the width, length and relative location of metal interconnects on said IC.

30. The process according to claim 28 wherein said one layer comprises the second metalization layer of said IC.

31. The process according to claim 30 wherein step (a) comprises the steps of:

mounting said IC on a motorized X-Y table such that the X-Y axes of said IC are roughly aligned with the X-Y axes of said table;

establishing a boundary about said IC by referencing first and second recognizable features located at opposite corners of said IC, said recognizable features being located in the same position on all of said layers;

capturing said magnified image of said one layer by successively capturing individual images of said section of said IC within said boundary by movement of said table along said X-Y axes.

32. The process according to claim 31 wherein step (b) comprises the steps of:

applying image processing/filtering algorithms to said tiled images to produce a corresponding set of contrast-enhanced images;

identifying said features of said contrast-enhanced images and generating said list therefrom;

building a composite image to generate said abstract representation of said one layer by matching said features at the edges of adjacent sections of said IC;

correlating said composite image with said contrast-enhanced images.

33. The process according to claim 32 wherein step (d) comprises the steps of:

aligning said abstract representation associated with each of said layers to said recognizable features; and combining said abstract representation associated with each of said layers to form said single intermediate representation of said IC.

34. The process according to claim 33 further comprising the steps of:

creating a set of identification features for each of said circuit elements contained in said single intermediate representation by tagging a subset of said list of features which most often uniquely identify said circuit elements; and calculating the relative distances between neighboring identification features.

35. The process according to claim 27 wherein step (e) comprises the steps, for each of said circuit elements to be recognized, of:

comparing said internal representation of each of said instances of said reference library circuits with said set of identification features associated with one of said circuit elements on said IC;

declaring a match when the correspondence between one of said circuit elements and one of said reference library circuits exceeds a predetermined threshold.

* * * * *